United States Patent
Fazelpour et al.

(12) 
(10) Patent No.: US 6,812,576 B1
(45) Date of Patent: Nov. 2, 2004

(54) FANNED OUT INTERCONNECT VIA STRUCTURE FOR ELECTRONIC PACKAGE SUBSTRATES

(75) Inventors: Siamak Fazelpour, San Diego, CA (US); Mark Patterson, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/145,496

(22) Filed: May 14, 2002

(51) Int. Cl.[7] ............................................. H01L 23/48
(52) U.S. Cl. ....................... 257/774; 257/775; 257/776
(58) Field of Search ................................. 257/208, 211, 257/773–776, 692, 700; 438/618, 629, 637–640, 666–668, 672, 675, 700, 701

(56) References Cited

U.S. PATENT DOCUMENTS 5,831,330 A * 11/1998 Chang ........................ 257/620
6,133,139 A * 10/2000 Dalal et al. .................. 438/624
6,329,610 B1 * 12/2001 Takubo et al. .............. 174/264

* cited by examiner

Primary Examiner—Hung Vu
(74) Attorney, Agent, or Firm—Incaplaw; Terrance A. Meador

(57) ABSTRACT

An interconnect via structure according to the present invention can be used to support high frequency broadband signal transmission. The interconnect vias progressively increase in size and pitch from the signal source layer of the package substrate to the terminal pad layer of the package substrate. Each interconnect via includes a plurality of conductive sections formed at different substrate layers. At each substrate layer, the size and pitch of the vias result in a specified impedance. In a practical embodiment, the via impedance at each substrate layer is constant (e.g., 50 ohms). The interconnect structure can maintain a constant impedance while transitioning from a relatively narrow pitch at the signal source layer to a relatively wide pitch at the terminal layer, which may correspond to the pitch of the package substrate solder balls.

2 Claims, 6 Drawing Sheets

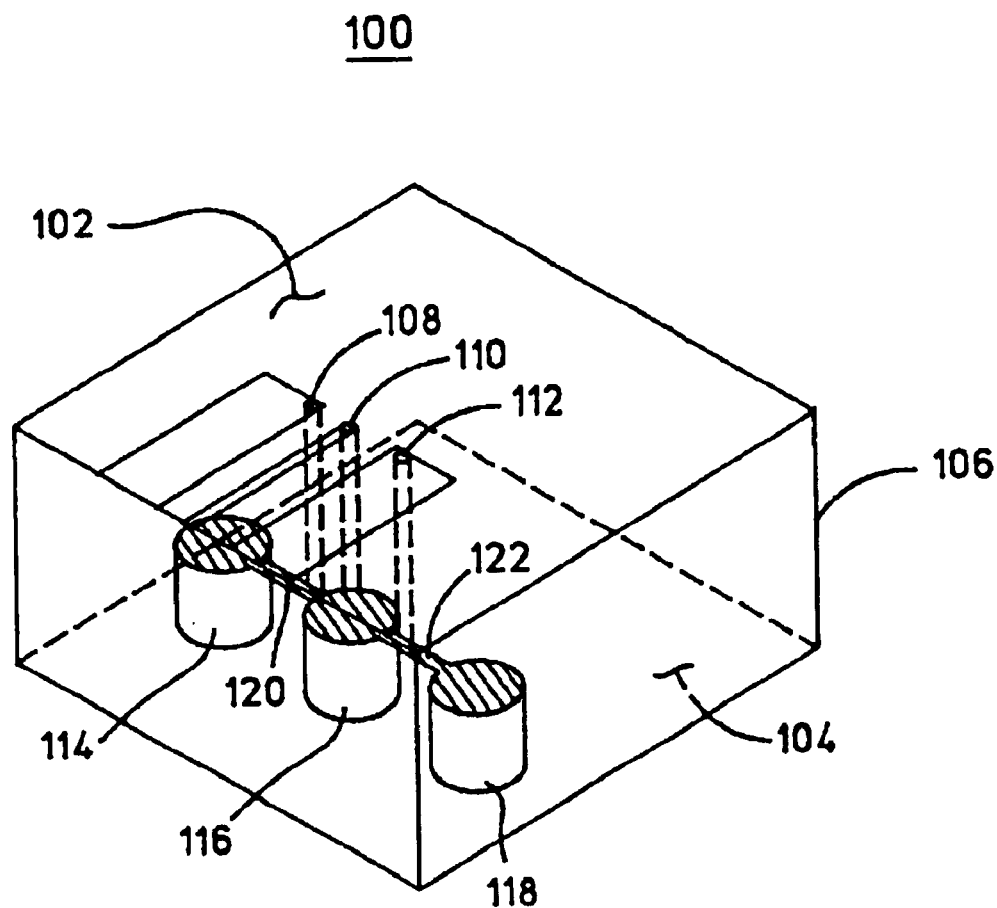
FIG. 1 — (PRIOR ART)

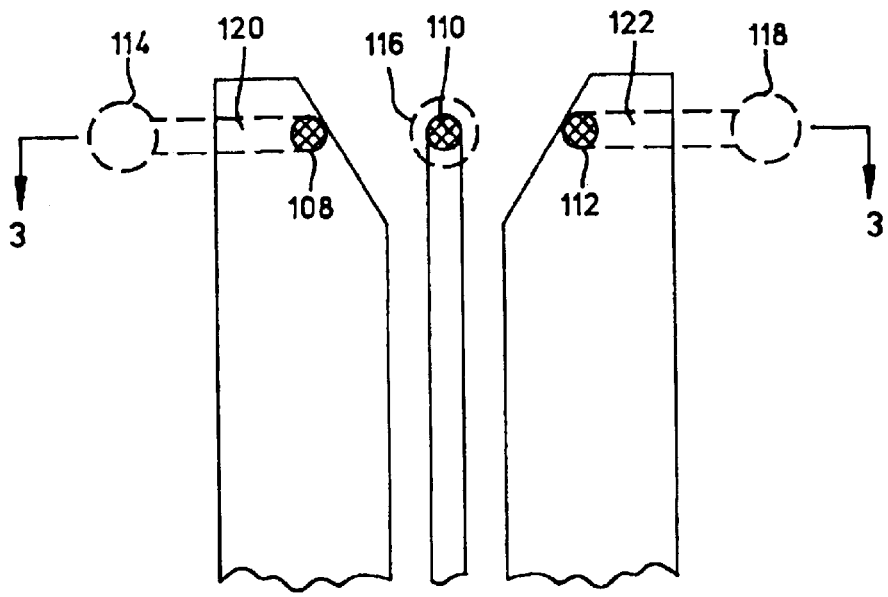
FIG. 2 – (PRIOR ART)
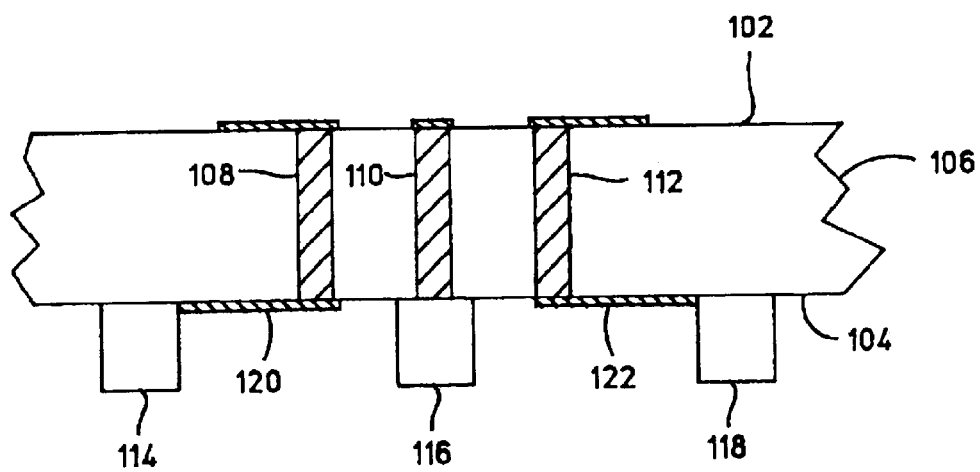
FIG. 3 – (PRIOR ART)

FANNED OUT INTERCONNECT VIA STRUCTURE FOR ELECTRONIC PACKAGE SUBSTRATES

FIELD OF THE INVENTION

The present invention relates generally to electronic device packaging. More particularly, the present invention relates to the design of an interconnect via structure for an electronic package substrate.

BACKGROUND OF THE INVENTION

An electronic package substrate includes an interconnect structure for routing signals from conductive traces or pads on the top surface of the substrate to conductive traces, pads, or solder balls on the bottom surface of the substrate. For example, electronic chips are often mounted in ball grid array ("BGA") packages that can be easily attached to a printed circuit board ("PCB") or an electronic component. A typical BGA package includes an electronic chip that is physically and electronically connected to a BGA substrate, which includes an interconnect arrangement that provides conductive paths between points on the chip-mounting substrate surface and corresponding solder balls located on the board-mounting substrate surface. BGA packages are often utilized for high speed electronic devices, e.g., circuits that handle input and/or output signals having data rates of up to 40 Gbps. The trace-to-via and via-to-pad transitions represent electrical discontinuities that limit the bandwidth of a signal propagating through the package. Indeed, in high speed applications, these transitions can cause problematic impedance mismatching, high insertion loss, and high reflection loss.

For very high data rate applications such as OC-768 (40 Gbps), trace-to-via and via-to-pad transitions can be avoided by using connectorized packages. Such packages employ connectors that receive the high speed signals directly from the top surface of the package substrate. Such connectorized packages can be very complex and expensive to manufacture. In addition, the package substrate must be unnecessarily thick to accommodate the high speed connectors, which can degrade the signal integrity of other signals handled by the interconnect structure of the electronic package.

In certain narrowband applications, the package substrate may employ a layout-based filter as a solution to the problems introduced by the via transitions. This approach can be risky because the center frequency of the filter may vary in response to manufacturing tolerances, thus rendering some of the packages unusable. Furthermore, this approach cannot be used for broadband applications.

BRIEF SUMMARY OF THE INVENTION

An electronic package substrate according to the present invention includes an interconnect structure comprising fanned out vias. The design of the vias results in very low return and insertion losses over a broadband frequency range, which makes the package suitable for high speed applications such as SONET OC-768. The interconnect via structure need not employ bulky high speed connectors that can adversely affect other signals within the package substrate.

The above and other aspects of the present invention may be carried out in one form by an electronic device interconnect substrate comprising a signal source layer, a terminal pad layer, and a plurality of interconnect vias, each extending between the signal source layer and the terminal pad layer, the plurality of vias corresponding to one lateral pitch at the signal source layer and another lateral pitch at the terminal pad layer.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 1 is a solid model depiction of a package substrate configured in accordance with conventional design techniques;

FIG. 2 is a schematic top view of the package substrate shown in FIG. 1;

FIG. 3 is a schematic cross-sectional view of the package substrate as viewed along line 3—3 in FIG. 2;

DETAILED DESCRIPTION OF A PREFERRED EMBODIMENT

Figure 4A:
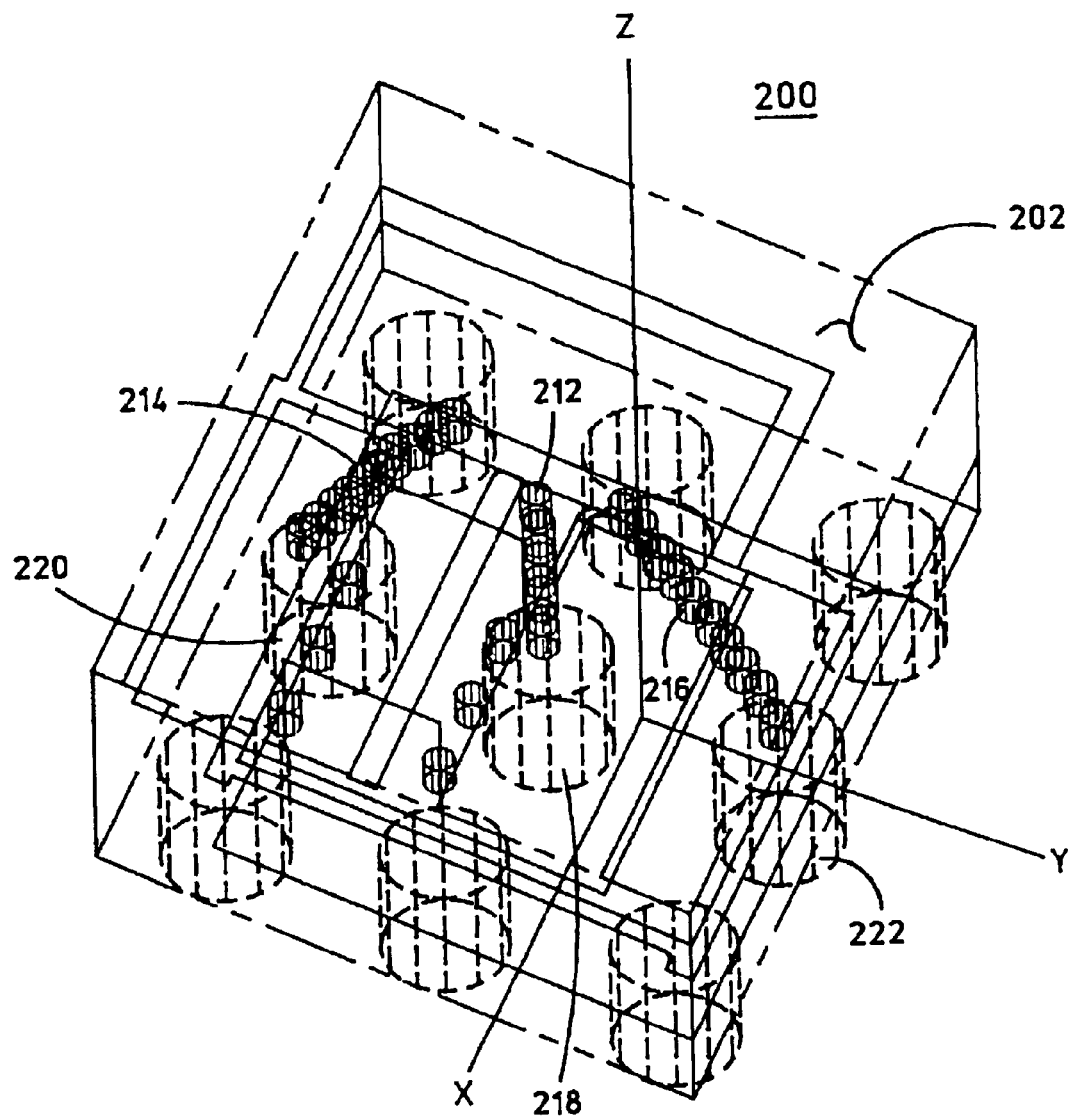
FIG. 4A is a solid model depiction of a package substrate with offset vias.

The particular implementations shown and described herein are illustrative of the invention and its best mode and are not intended to otherwise limit the scope of the invention in any way. Indeed, for the sake of brevity, conventional techniques related to electronic device manufacturing, high speed signal transmission, flip-chip design, solder bump composition, deposition, and reflow, via fabrication, and other aspects of the interconnect structures may not be described in detail herein.

FIG. 1 is a phantom solid model depiction of an electronic package substrate 100 configured in accordance with conventional design techniques. FIG. 2 is a schematic top view of package substrate 100, and FIG. 3 is a schematic cross-sectional view of package substrate 100 as viewed along line 3—3 in FIG. 2. Package substrate 100 can be utilized to route electronic signals from a signal source layer 102 to a terminal pad layer 104. A suitably configured interconnect structure is utilized to route the signals through the substrate material 106, which may be a ceramic material such as alumina, an organic dielectric material, or any suitable material. In many practical applications, package substrate 100 is a multilayered component having a plurality of metal layers sandwiched between a plurality of dielectric layers.

The interconnect structure of package substrate 100 includes three interconnect vias 108/110/112, each of which extends from signal source layer 102 to terminal pad layer 104. Via 110 represents the signal via, and vias 108/112 each represent a reference via. As best shown in FIG. 3, each of the interconnect vias 108/110/112 is a straight via having a uniform cross-sectional area along its length, and the interconnect vias 108/110/112 have a constant pitch (i.e., the distance from the longitudinal axis of one via to the longitudinal axis of each of its neighboring vias).

Terminal pad layer 104 serves as the mounting surface of package substrate 100. In this regard, a number of terminal connections, e.g., solder balls, are attached to terminal pad layer 104. Package substrate 100 includes a solder ball 114 corresponding to reference via 108, a solder ball 116 corresponding to signal via 110, and a solder ball 118 corresponding to reference via 112. The pitch of the solder balls on package substrate 100 is greater than the pitch of vias 108/110/112. Consequently, interconnect via 108 is connected to solder ball 114 using a lateral conductive trace 120, and interconnect via 112 is connected to solder ball 118 using a lateral conductive trace 122. In FIG. 2, the solder balls and lateral traces are shown in dashed lines because they would otherwise be hidden from view.

The use of straight interconnect vias and lateral conductive traces is acceptable for relatively low speed signal transmission or in other applications where high insertion and reflection losses can be tolerated. Such designs, however, may be inadequate in very high speed broadband applications (e.g., those that support data rates of up to 40 Gbps).

Figure 5:
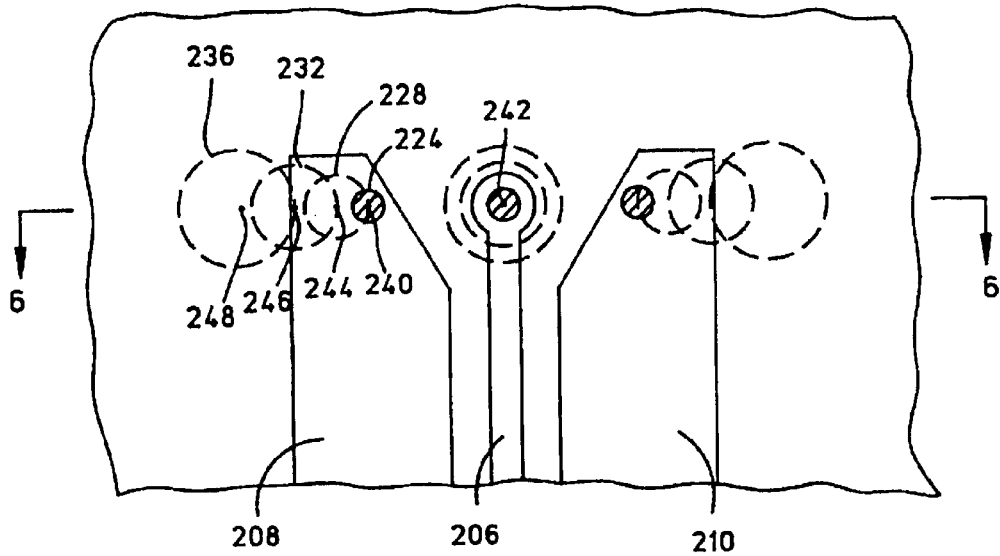
FIG. 5 is a schematic top view of the package substrate shown in FIG. 4.
Figure 6:
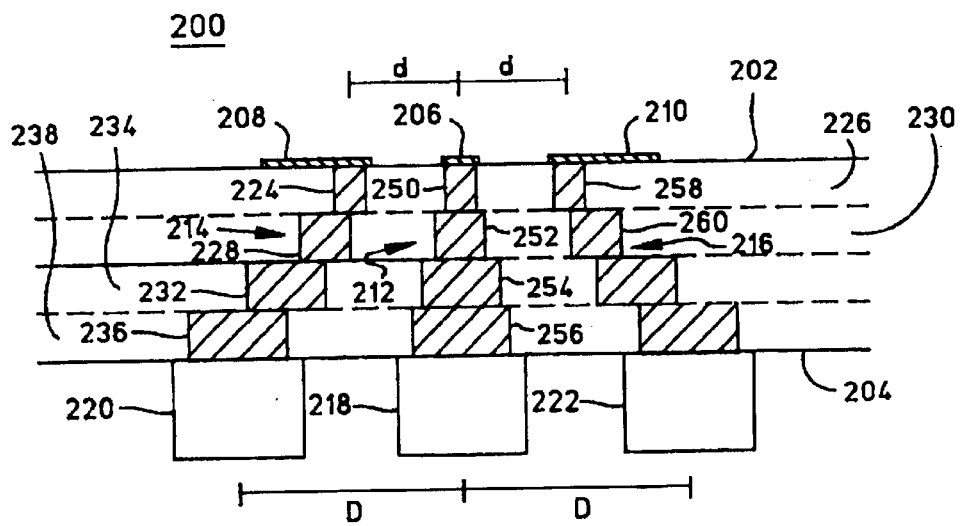
FIG. 6 is a schematic cross-sectional view of the package substrate as viewed along line 6—6 in FIG. 5.

FIG. 4A is a phantom model depiction of an electronic package substrate 200 configured in accordance with the present invention, FIG. 5 is a schematic top view of package substrate 200, and FIG. 6 is a schematic cross-sectional view of package substrate 200 as viewed along line 6—6 in FIG. 5. These figures represent a simple model suitable for purposes of the following description of the inventive concepts. A practical substrate that incorporates the present invention, however, will likely employ a more complex interconnect structure, a more complex arrangement of conductive traces, and other conventional features not shown or described herein. Furthermore, these figures are merely intended to illustrate the techniques of the present invention and, therefore, are not to scale.

Electronic package substrate 200 is preferably realized as a multilayer component having a number of conductive layers and a number of dielectric layers. The package substrate 200 may be an HTCC substrate, an LTCC substrate, or formed from any suitable substrate material. The dielectric material may be a ceramic material, e.g., alumina, an organic material, or any suitable material. The conductive layers include at least a signal source layer (located on the upper surface 202 of package substrate 200) and a terminal pad layer (located on the lower surface 204 of package substrate 200 and opposite signal source layer 202). The conductive layers may also include any number of internal layers separated by dielectric layers. In practical embodiments, the conductive layers are formed from metal such as copper; the conductive layers may be etched or otherwise fabricated to define conductive metal traces, conductive connection pads, coplanar waveguides, electronic components, and other features associated with the particular electronic function of package substrate 200.

The signal source layer in the example embodiment includes a conductive signal trace 206, a conductive reference trace 208, and a conductive reference trace 210. Although not a requirement of the invention, these traces form a coplanar waveguide transmission line on upper surface 202. These traces are configured to form an electrical connection with a respective number of interconnect vias. In this regard, conductive signal trace 206 couples to a signal via 212, conductive reference trace 208 couples to a reference via 214, and conductive reference trace 210 couples to a reference via 216. To accommodate the trace-to-via transition, for compliance with the particular signal source design requirements, and/or for compliance with electronic device interface characteristics (e.g., flip-chip solder bump layout), the pitch between signal via 212 and reference via 214 (at the signal source layer) equals the pitch between signal via 212 and reference via 216. The length d identified in FIG. 6 represents this pitch.

Package substrate 200 includes a number of conductive terminal elements formed on the terminal pad layer. In a practical embodiment, the conductive terminal elements are solder balls that form a portion of a ball grid array ("BGA"). As best shown in FIG. 6, package substrate 200 includes a signal solder ball 218 coupled to signal via 212, a reference solder ball 220 coupled to reference via 214, and a reference solder ball 222 coupled to reference via 216. The pitch (at the terminal pad layer) between solder ball 218 and solder ball 220 equals the pitch between solder ball 218 and solder ball 222. The length D identified in FIG. 6 represents this pitch. Notably, the pitch D is greater than the pitch d.

Package substrate 200 preferably employs at least one offset via (e.g., reference vias 214/216) that spans a lateral distance from upper surface 202 to lower surface 204. Package substrate 200 utilizes such offset vias to handle the change in via pitch between upper surface 202 to lower surface 204 in lieu of lateral conductive traces.

In accordance with the illustrated embodiment, reference via 214 includes a plurality of stepped or offset conductive sections. A conductive section 224 is formed within a layer 226 of package substrate 200, a conductive section 228 is formed within a different layer 230, a conductive section 232 is formed within yet another layer 234, and a conductive section 236 is formed within another layer 238. Conductive section 224 represents one conductive end section of via 214, and conductive section 236 represents the other conductive end section of via 214. In a practical embodiment, conductive section 224 is connected to a conductive element in the signal source layer, e.g., reference trace 208, and conductive section 236 is connected to a conductive element in the terminal pad layer, e.g., a BGA solder ball pad (not shown). Each of the neighboring conductive sections are connected to form a conductive path therebetween. In this regard, conductive section 228 serves as a conductive path between conductive section 224 and conductive section 232, and the combination of conductive section 228 coupled with conductive section 232 serves as a conductive path between conductive section 224 and conductive section 236. Although four conductive sections and four layers are shown in FIG. 6, any number of conductive sections and layers can be utilized by a practical embodiment of the present invention.

The lateral centerpoint of conductive section 224 (identified by reference number 240 in FIG. 5) corresponds to the longitudinal axis of conductive section 224. Assuming that conductive section 224 is cylindrical in shape, lateral centerpoint 240 corresponds to the center of the circular cross section of conductive section 224. The lateral centerpoint 240 and the lateral centerpoint 242 of the corresponding conductive section of signal via 212 are separated by the pitch d. The lateral centerpoint of conductive section 228 (identified by reference number 244) is laterally offset from the lateral reference point 240 associated with conductive section 224. Similarly, the lateral centerpoint point 246 of conductive section 232 and the lateral centerpoint 248 of conductive section 236 are also offset from lateral centerpoint 240. Substrate 200 is configured such that lateral centerpoint 244 is positioned between lateral centerpoint 240 and lateral centerpoint 246, lateral centerpoint 246 is positioned between lateral centerpoint 244 and lateral centerpoint 248, and lateral centerpoints 244/246 are each positioned between lateral centerpoints 240/248.

Figure 4B:
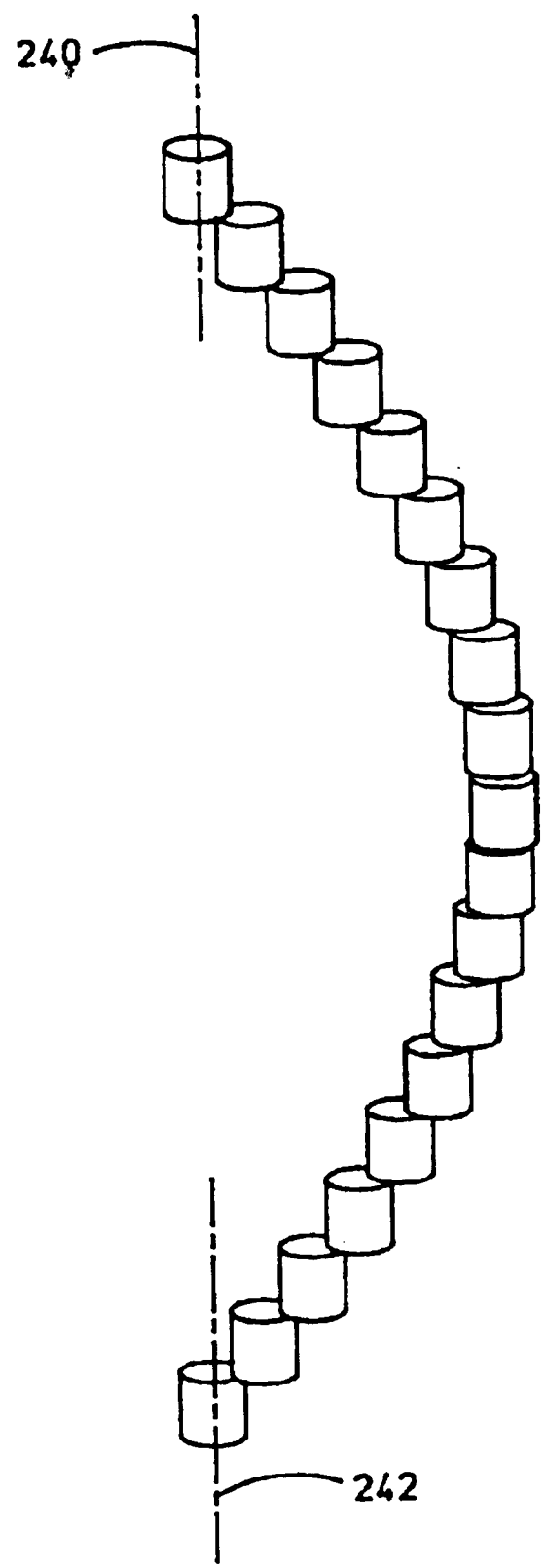
FIG. 4B is a solid model depiction of an offset via having a curved or spiral path configured in accordance with the present invention.

In the example embodiment, the lateral centerpoints of the conductive sections of reference via 214 are increasingly offset, relative to lateral centerpoint 240, from conductive section 224 to conductive section 236. This characteristic, however, represents only one possible configuration of an interconnect via according to the present invention. An alternately configured via may have two or more adjoining conductive sections having aligned lateral centerpoints (as exhibited by signal via 212). Furthermore, the lateral centerpoint offset of the conductive sections need not progressively increase or follow any specific pattern. For example, if desirable, the offset of the lateral centerpoints relative to lateral centerpoint 240 may increase, decrease, and increase again. Furthermore, the lateral centerpoints of the conductive sections need not be linearly aligned (as depicted in FIG. 5). In other words, the lateral centerpoints, when viewed from the perspective of FIG. 5, may follow any suitable path, e.g., a curved or spiral path as shown in FIG. 4B, an angled path, or the like.

Reference via 216 also has a plurality of offset conductive sections, as shown in FIG. 5 and FIG. 6. Reference via 216 and reference via 214 may be symmetrical about signal via 212 (as depicted). Notably, the offset nature of reference vias 214/216 results in a pitch of 2d between the reference vias at upper surface 202 and a pitch of 2D between the reference vias at lower surface 204.

Although not a requirement of the present invention, signal via 212 includes a number of conductive sections having aligned lateral centerpoints. This common lateral centerpoint corresponds to the centerpoint of solder ball 218. The offset configuration of reference via 214, combined with the aligned configuration of signal via 212, results in a first pitch (d) at upper surface 202 and a second pitch (D) at lower surface 204. Similarly, the offset configuration of reference via 216, combined with the aligned configuration of signal via 212, results in a first pitch (d) at upper surface 202 and a second pitch (D) at lower surface 204.

In most practical applications, the impedance of the interconnect vias matches the impedance of the transmission line formed by the conductive traces on the signal source layer. For example, many high speed applications utilize coplanar waveguide transmission lines having an impedance of 50 ohms; ideally, the impedance associated with the corresponding signal via and reference vias is also 50 ohms. To maintain or closely approximate a constant interconnect impedance, a substrate package according to the present invention employs at least one via having a varied cross sectional area along its length. For example, each via in substrate package 200 is configured in this manner.

Signal via 212 includes a conductive section 250 having a first longitudinal cross-sectional area. In the example embodiment, each conductive section is cylindrical in shape, and each conductive section has a uniform diameter and a uniform circular cross-sectional shape. This cross-sectional shape is illustrated in dashed lines in FIG. 5. Signal via 212 also includes a conductive section 252 connected to conductive section 250. Conductive section 252 has a second longitudinal cross-sectional area that differs from the longitudinal cross-sectional area of conducive section 250. The cross-sectional area of conductive section 252 is greater than the cross-sectional area of conductive section 250. Likewise, signal via 212 is configured such that the cross-sectional area of conductive section 254 is greater than the cross-sectional area of conductive section 252, and such that the cross-sectional area of conductive section 256 is greater than the cross-sectional area of conductive section 254. As best shown in FIG. 6, signal via 212 is a stepped configuration having a progressively increasing cross-sectional area from the uppermost conductive section to the lowermost conductive section.

In the example embodiment, each of the reference vias 214/216 is also formed with conductive sections that progressively increase in size from the uppermost conductive section to the lowermost conductive section. The size of the conductive sections at each substrate layer is preferably the same for signal via 212, reference via 214, and reference via 216. In other words, the cross-sectional area of conductive section 224 of reference via 214 equals both the cross-sectional area of conductive section 250 of signal via 212 and the cross-sectional area of conductive section 258 of reference via 216. The cross-sectional area and pitch of these conductive sections are selected to provide a specified impedance for this portion of the interconnect structure. In practice, the size and pitch of the conductive sections are chosen to provide a 50 ohm impedance.

At the next substrate level, the cross-sectional area of conductive section 228 equals both the cross-sectional area of conductive section 252 and the cross-sectional area of conductive section 260 of reference via 216. As mentioned above, the cross-sectional area of each via at this layer is greater than the crosssectional area at the previous layer. In the preferred embodiment, the cross-sectional area and pitch of conductive sections 228/252/260 are selected such that the impedance of this portion of the interconnect structure matches the impedance of the preceding portion. In the practical embodiment, the cross-sectional area and pitch of conductive sections 228/252/260 are increased by a suitable amount, relative to conductive sections 224/250/258, to maintain the 50 ohm impedance associated with the vias. This impedance matching scheme is followed at each subsequent substrate layer.

In the preferred embodiment, each of the vias 212/214/216 includes a plurality of conductive sections, where each of the conductive sections has a different cross-sectional area. Alternatively, a via may include two or more conductive sections having the same cross-sectional area, and a via need not progressively increase or decrease in size.

Figure 7:
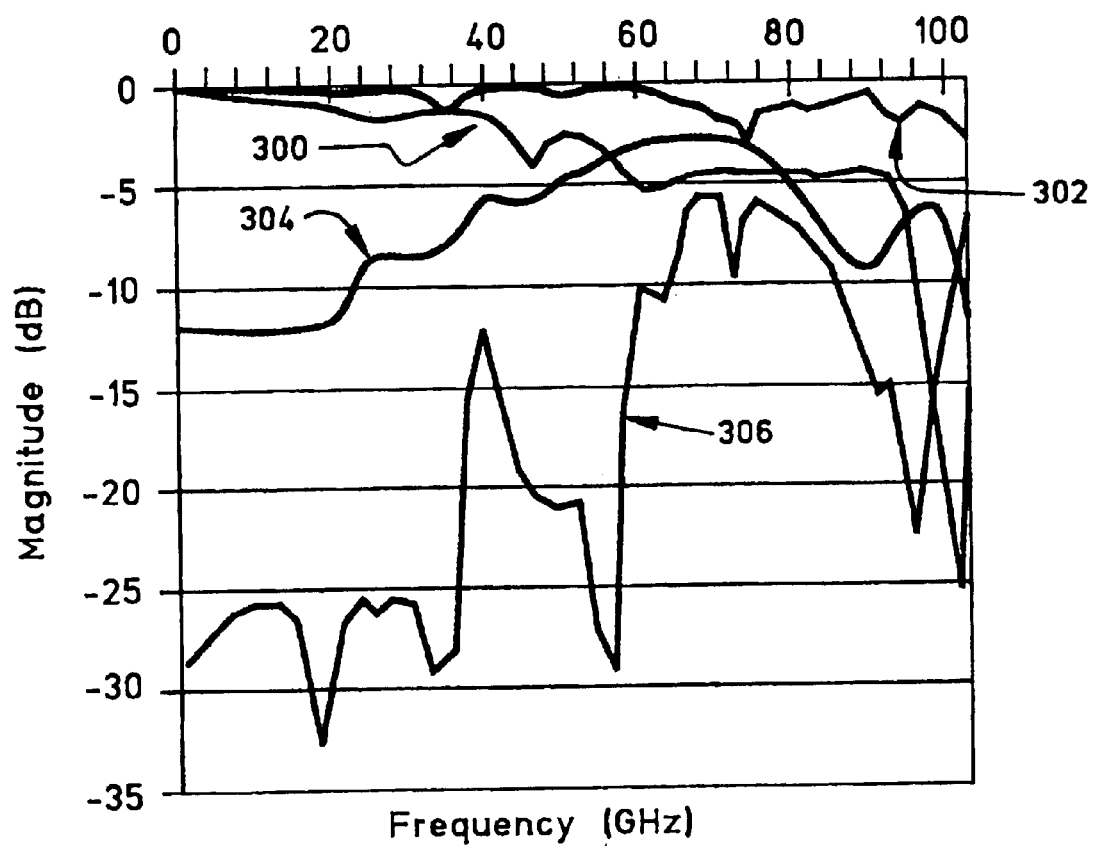
FIG. 7 is a graph of insertion loss and reflection loss for the package substrates shown in FIG. 1 and FIG. 4.

FIG. 7 is a graph of insertion loss and reflection loss for the package substrates shown in FIG. 1 and FIG. 4A. These simulations are based on a solid model of a BGA substrate having an HTCC substrate with dielectric constant of 8.8, 16 mil solder balls, and a solder ball pitch of 32 mils. The test results are taken with respect to one port on the 50 ohm trace on the top layer and a second port at the end of the solderball on the package substrate. A result 300 represents the insertion loss for the conventional package with straight vias. In contrast, a result 302 represents the insertion loss for a package that employs the interconnect via structure of the present invention. Notably, insertion loss remains less than −2.34 dB up to 100 GHz for the package with offset vias. A result 304 represents the return loss for the conventional package, while a result 306 represents the return loss for the package with offset vias. Using the techniques of the present invention, the return loss is improved across the broad frequency band up to 100 GHz.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An interconnect via formed within an interconnect substrate, said interconnect via comprising:

a first conductive section having a first longitudinal cross-sectional area and a first lateral centerpoint;

a second conductive section having a second longitudinal cross-sectional area, said second longitudinal cross-sectional area being different than said first longitudinal cross-sectional area and a second lateral centerpoint aligned with said first lateral centerpoint; and a conductive path through the interconnect substrate connecting said first conductive section to said second conductive section;

said conductive path including a plurality of conductive internal sections connected together, each of said conductive internal sections having a respective lateral centerpoint positioned between said first and second lateral centerpoints, and each of said conductive internal sections being in direct contact with at least one other of said conductive internal sections;

said plurality of conductive internal sections disposed in a spiral pattern in the interconnect substrate.

2. An electronic interconnect substrate comprising:

a signal source layer having a first lateral centerpoint;

a terminal pad layer having a second lateral centerpoint aligned with said first lateral centerpoint;

an interconnect substrate between said signal source layer and said terminal pad layer; and a plurality of interconnect vias, each extending through said interconnect substrate between said signal source layer and said terminal pad layer, said plurality of vias corresponding to one lateral pitch at said signal source layer and another lateral pitch at said terminal pad layer;

each of said interconnect vias including a plurality of conductive internal sections connected together, each of said conductive internal sections having a respective lateral centerpoint positioned between said first and second lateral centerpoints, and each of said conductive internal sections being in direct contact with at least one other of said conductive internal sections;

said plurality of conductive internal sections disposed in a curved path through the interconnect substrate.

* * * * *